United States Patent
Pan et al.

(10) Patent No.: US 9,214,174 B1
(45) Date of Patent: Dec. 15, 2015

(54) METHOD OF MANUFACTURING A DISK DRIVE HEAD GIMBAL ASSEMBLY HAVING A FLEXURE TAIL WITH FOLDED BOND PADS

(71) Applicant: Western Digital Technologies, Inc., Irvine, CA (US)

(72) Inventors: Tzong-Shii Pan, San Jose, CA (US); Fernando A. Magsombol, Muntinlupa (PH)

(73) Assignee: Western Digital Technologies, Inc., Irvine, CA (US)

( * ) Notice: Subject to any disclaimer, the term of this patent is extended or adjusted under 35 U.S.C. 154(b) by 306 days.

(21) Appl. No.: 13/897,609

(22) Filed: May 20, 2013

Related U.S. Application Data

(62) Division of application No. 12/916,237, filed on Oct. 29, 2010, now Pat. No. 8,467,153.

(51) Int. Cl.
*G11B 5/84* (2006.01)
*G11B 5/48* (2006.01)
*G11B 5/127* (2006.01)
(Continued)

(52) U.S. Cl.
CPC .............. *G11B 5/4846* (2013.01); *G11B 5/127* (2013.01); *G11B 5/486* (2013.01); *G11B 5/4853* (2013.01); *G11B 5/84* (2013.01); *H05K 1/118* (2013.01); *H05K 1/189* (2013.01); *Y10T 29/49025* (2015.01); *Y10T 29/49027* (2015.01); *Y10T 29/49124* (2015.01); *Y10T 29/49147* (2015.01); *Y10T 29/49222* (2015.01)

(58) Field of Classification Search
CPC ........ G11B 5/84; G11B 5/127; G11B 5/4846; G11B 5/4853; G11B 5/486; H05K 1/118; H05K 1/189; Y10T 29/49025; Y10T 29/49027; Y10T 29/49124; Y10T 29/49147; Y10T 29/49222
See application file for complete search history.

(56) References Cited

U.S. PATENT DOCUMENTS

| | | | |
|---|---|---|---|
| 5,103,359 | A | 4/1992 | Marazzo |
| 5,235,482 | A | 8/1993 | Schmitz |
| 5,465,186 | A | 11/1995 | Bajorek et al. |

(Continued)

FOREIGN PATENT DOCUMENTS

| | | | |
|---|---|---|---|
| JP | 10275430 A | * | 10/1998 |
| JP | 2007173363 A | * | 7/2007 |

OTHER PUBLICATIONS

Notice of Allowance dated Apr. 11, 2012 from U.S. Appl. No. 13/078,829, 22 pages.

(Continued)

*Primary Examiner* — A. Dexter Tugbang

(57) ABSTRACT

A method to manufacture a head stack assembly for a disk drive, the method comprising: attaching a head gimbal assembly that includes a flexure tail having flexure bond pads to an actuator that includes a flexible printed circuit (FPC) with FPC bond pads; folding each of the flexure bond pads upon itself such that the flexure tail is substantially thicker at each of the folded flexure bond pads; aligning the flexure bond pads with the FPC bond pads; introducing an adhesive material that includes electrically conductive beads of substantially similar size between each of the flexure bond pads and corresponding ones of the FPC bond pads; and bringing a thermode tool into contact with the flexure bond pads after folding, with the thermode tool pressing the flexure bond pads against the FPC bond pads for a period.

10 Claims, 9 Drawing Sheets

(51) Int. Cl.
*H05K 1/11* (2006.01)
*H05K 1/18* (2006.01)

(56) References Cited

U.S. PATENT DOCUMENTS

| | | |
|---|---|---|
| 5,861,661 A | 1/1999 | Tang et al. |
| 5,903,056 A | 5/1999 | Canning et al. |
| 6,036,813 A | 3/2000 | Schulz et al. |
| 6,046,889 A | 4/2000 | Berding et al. |
| 6,052,890 A | 4/2000 | Malagrino, Jr. et al. |
| 6,061,206 A | 5/2000 | Foisy et al. |
| 6,076,256 A | 6/2000 | Drake et al. |
| 6,101,876 A | 8/2000 | Brooks et al. |
| 6,147,831 A | 11/2000 | Kennedy et al. |
| 6,151,189 A | 11/2000 | Brooks |
| 6,151,197 A | 11/2000 | Larson et al. |
| 6,185,067 B1 | 2/2001 | Chamberlain |
| 6,185,074 B1 | 2/2001 | Wang et al. |
| 6,208,486 B1 | 3/2001 | Gustafson et al. |
| 6,212,046 B1 | 4/2001 | Albrecht et al. |
| 6,215,616 B1 | 4/2001 | Phan et al. |
| 6,228,689 B1 | 5/2001 | Liu |
| 6,272,694 B1 | 8/2001 | Knoth |
| 6,288,866 B1 | 9/2001 | Butler et al. |
| 6,292,333 B1 | 9/2001 | Blumentritt et al. |
| 6,344,950 B1 | 2/2002 | Watson et al. |
| 6,349,464 B1 | 2/2002 | Codilian et al. |
| 6,351,352 B1 | 2/2002 | Khan et al. |
| 6,381,099 B1 | 4/2002 | Mei |
| 6,382,499 B1 | 5/2002 | Satoh et al. |
| 6,388,873 B1 | 5/2002 | Brooks et al. |
| 6,399,889 B1 | 6/2002 | Korkowski et al. |
| 6,417,979 B1 | 7/2002 | Patton, III et al. |
| 6,421,208 B1 | 7/2002 | Oveyssi |
| 6,441,998 B1 | 8/2002 | Abrahamson |
| 6,462,914 B1 | 10/2002 | Oveyssi et al. |
| 6,466,398 B1 | 10/2002 | Butler et al. |
| 6,469,871 B1 | 10/2002 | Wang |
| 6,502,300 B1 | 1/2003 | Casey et al. |
| 6,519,116 B1 | 2/2003 | Lin et al. |
| 6,529,345 B1 | 3/2003 | Butler et al. |
| 6,529,351 B1 | 3/2003 | Oveyssi et al. |
| 6,535,358 B1 | 3/2003 | Hauert et al. |
| 6,545,382 B1 | 4/2003 | Bennett |
| 6,549,381 B1 | 4/2003 | Watson |
| 6,560,065 B1 | 5/2003 | Yang et al. |
| 6,571,460 B1 | 6/2003 | Casey et al. |
| 6,574,073 B1 | 6/2003 | Hauert et al. |
| 6,580,574 B1 | 6/2003 | Codilian |
| 6,594,111 B1 | 7/2003 | Oveyssi et al. |
| 6,603,620 B1 | 8/2003 | Berding |
| 6,614,623 B2 | 9/2003 | Nakamura et al. |
| 6,618,222 B1 | 9/2003 | Watkins et al. |
| 6,624,966 B1 | 9/2003 | Ou-Yang et al. |
| 6,624,980 B1 | 9/2003 | Watson et al. |
| 6,624,983 B1 | 9/2003 | Berding |
| 6,628,473 B1 | 9/2003 | Codilian et al. |
| 6,634,086 B2 | 10/2003 | Korkowski et al. |
| 6,639,757 B2 | 10/2003 | Morley et al. |
| 6,654,200 B1 | 11/2003 | Alexander et al. |
| 6,656,772 B2 | 12/2003 | Huang |
| 6,657,811 B1 | 12/2003 | Codilian |
| 6,661,597 B1 | 12/2003 | Codilian et al. |
| 6,661,603 B1 | 12/2003 | Watkins et al. |
| 6,674,600 B1 | 1/2004 | Codilian et al. |
| 6,690,637 B1 | 2/2004 | Codilian |
| 6,693,767 B1 | 2/2004 | Butler |
| 6,693,773 B1 | 2/2004 | Sassine |
| 6,697,217 B1 | 2/2004 | Codilian |
| 6,698,286 B1 | 3/2004 | Little et al. |
| 6,700,736 B1 | 3/2004 | Wu et al. |
| 6,703,566 B1 | 3/2004 | Shiraishi et al. |
| 6,704,167 B1 | 3/2004 | Scura et al. |
| 6,707,637 B1 | 3/2004 | Codilian et al. |
| 6,707,641 B1 | 3/2004 | Oveyssi et al. |
| 6,708,389 B1 | 3/2004 | Carlson et al. |
| 6,710,980 B1 | 3/2004 | Hauert et al. |
| 6,710,981 B1 | 3/2004 | Oveyssi et al. |
| 6,728,062 B1 | 4/2004 | Ou-Yang et al. |
| 6,728,063 B1 | 4/2004 | Gustafson et al. |
| 6,731,470 B1 | 5/2004 | Oveyssi |
| 6,735,033 B1 | 5/2004 | Codilian et al. |
| 6,741,426 B2 | 5/2004 | Girard |
| 6,741,428 B1 | 5/2004 | Oveyssi |
| 6,751,051 B1 | 6/2004 | Garbarino |
| 6,754,042 B1 | 6/2004 | Chiou et al. |
| 6,757,132 B1 | 6/2004 | Watson et al. |
| 6,757,137 B1 | 6/2004 | Mei |
| 6,759,784 B1 | 7/2004 | Gustafson et al. |
| 6,781,780 B1 | 8/2004 | Codilian |
| 6,781,787 B1 | 8/2004 | Codilian et al. |
| 6,781,791 B1 | 8/2004 | Griffin et al. |
| 6,790,066 B1 | 9/2004 | Klein |
| 6,791,791 B1 | 9/2004 | Alfred et al. |
| 6,791,801 B1 | 9/2004 | Oveyssi |
| 6,795,262 B1 | 9/2004 | Codilian et al. |
| 6,798,603 B1 | 9/2004 | Singh et al. |
| 6,801,389 B1 | 10/2004 | Berding et al. |
| 6,801,404 B1 | 10/2004 | Oveyssi |
| 6,816,342 B1 | 11/2004 | Oveyssi |
| 6,816,343 B1 | 11/2004 | Oveyssi |
| 6,825,622 B1 | 11/2004 | Ryan et al. |
| 6,826,009 B1 | 11/2004 | Scura et al. |
| 6,831,810 B1 | 12/2004 | Butler et al. |
| 6,839,199 B1 | 1/2005 | Alexander, Jr. et al. |
| 6,844,996 B1 | 1/2005 | Berding et al. |
| 6,847,504 B1 | 1/2005 | Bennett et al. |
| 6,847,506 B1 | 1/2005 | Lin et al. |
| 6,856,491 B1 | 2/2005 | Oveyssi |
| 6,856,492 B2 | 2/2005 | Oveyssi |
| 6,862,154 B1 | 3/2005 | Subrahmanyam et al. |
| 6,862,156 B1 | 3/2005 | Lin et al. |
| 6,862,176 B1 | 3/2005 | Codilian et al. |
| 6,865,049 B1 | 3/2005 | Codilian et al. |
| 6,865,055 B1 | 3/2005 | Ou-Yang et al. |
| 6,867,946 B1 | 3/2005 | Berding et al. |
| 6,867,950 B1 | 3/2005 | Lin |
| 6,876,514 B1 | 4/2005 | Little |
| 6,879,466 B1 | 4/2005 | Oveyssi et al. |
| 6,888,697 B1 | 5/2005 | Oveyssi |
| 6,888,698 B1 | 5/2005 | Berding et al. |
| 6,891,696 B1 | 5/2005 | Ou-Yang et al. |
| 6,898,052 B1 | 5/2005 | Oveyssi |
| 6,900,961 B1 | 5/2005 | Butler |
| 6,906,880 B1 | 6/2005 | Codilian |
| 6,906,897 B1 | 6/2005 | Oveyssi |
| 6,908,330 B2 | 6/2005 | Garrett et al. |
| 6,922,308 B1 | 7/2005 | Butler |
| 6,930,848 B1 | 8/2005 | Codilian et al. |
| 6,930,857 B1 | 8/2005 | Lin et al. |
| 6,934,126 B1 | 8/2005 | Berding et al. |
| 6,937,441 B2 | 8/2005 | Okamoto et al. |
| 6,937,444 B1 | 8/2005 | Oveyssi |
| 6,940,698 B2 | 9/2005 | Lin et al. |
| 6,941,642 B1 | 9/2005 | Subrahmanyam et al. |
| 6,947,251 B1 | 9/2005 | Oveyssi et al. |
| 6,950,275 B1 | 9/2005 | Ali et al. |
| 6,950,284 B1 | 9/2005 | Lin |
| 6,952,318 B1 | 10/2005 | Ngo |
| 6,954,329 B1 | 10/2005 | Ojeda et al. |
| 6,958,884 B1 | 10/2005 | Ojeda et al. |
| 6,958,890 B1 | 10/2005 | Lin et al. |
| 6,961,212 B1 | 11/2005 | Gustafson et al. |
| 6,961,218 B1 | 11/2005 | Lin et al. |
| 6,963,469 B1 | 11/2005 | Gustafson et al. |
| 6,965,500 B1 | 11/2005 | Hanna et al. |
| 6,967,800 B1 | 11/2005 | Chen et al. |
| 6,967,804 B1 | 11/2005 | Codilian |
| 6,967,820 B2 | 11/2005 | Horie et al. |
| 6,970,329 B1 | 11/2005 | Oveyssi et al. |
| 6,972,924 B1 | 12/2005 | Chen et al. |
| 6,972,926 B1 | 12/2005 | Codilian |
| 6,975,476 B1 | 12/2005 | Berding |
| 6,979,931 B1 | 12/2005 | Gustafson et al. |

(56) References Cited

U.S. PATENT DOCUMENTS

| | | |
|---|---|---|
| 6,980,391 B1 | 12/2005 | Haro |
| 6,980,401 B1 | 12/2005 | Narayanan et al. |
| 6,982,853 B1 | 1/2006 | Oveyssi et al. |
| 6,989,953 B1 | 1/2006 | Codilian |
| 6,990,727 B1 | 1/2006 | Butler et al. |
| 6,992,862 B2 | 1/2006 | Childers et al. |
| 6,996,893 B1 | 2/2006 | Ostrander et al. |
| 7,000,309 B1 | 2/2006 | Klassen et al. |
| 7,006,324 B1 | 2/2006 | Oveyssi et al. |
| 7,013,731 B1 | 3/2006 | Szeremeta et al. |
| 7,031,104 B1 | 4/2006 | Butt et al. |
| 7,035,053 B1 | 4/2006 | Oveyssi et al. |
| 7,050,270 B1 | 5/2006 | Oveyssi et al. |
| 7,057,852 B1 | 6/2006 | Butler et al. |
| 7,062,837 B1 | 6/2006 | Butler |
| 7,064,921 B1 | 6/2006 | Yang et al. |
| 7,064,922 B1 | 6/2006 | Alfred et al. |
| 7,064,932 B1 | 6/2006 | Lin et al. |
| 7,075,701 B2 | 7/2006 | Novotny et al. |
| 7,085,098 B1 | 8/2006 | Yang et al. |
| 7,085,108 B1 | 8/2006 | Oveyssi et al. |
| 7,092,216 B1 | 8/2006 | Chang et al. |
| 7,092,251 B1 | 8/2006 | Henry |
| 7,099,099 B1 | 8/2006 | Codilian et al. |
| 7,099,117 B1 | 8/2006 | Subrahmanyam et al. |
| 7,113,371 B1 | 9/2006 | Hanna et al. |
| 7,142,397 B1 | 11/2006 | Venk |
| 7,145,753 B1 | 12/2006 | Chang et al. |
| 7,154,708 B2 | 12/2006 | Chhabra et al. |
| RE39,478 E | 1/2007 | Hatch et al. |
| 7,161,768 B1 | 1/2007 | Oveyssi |
| 7,161,769 B1 | 1/2007 | Chang et al. |
| 7,180,711 B1 | 2/2007 | Chang et al. |
| 7,193,819 B1 | 3/2007 | Chen et al. |
| 7,205,484 B2 | 4/2007 | Shiraishi et al. |
| 7,209,317 B1 | 4/2007 | Berding et al. |
| 7,209,319 B1 | 4/2007 | Watkins et al. |
| D542,289 S | 5/2007 | Diebel |
| 7,212,377 B1 | 5/2007 | Ou-Yang et al. |
| 7,215,513 B1 | 5/2007 | Chang et al. |
| 7,215,514 B1 | 5/2007 | Yang et al. |
| 7,224,551 B1 | 5/2007 | Ou-Yang et al. |
| D543,981 S | 6/2007 | Diebel |
| 7,227,725 B1 | 6/2007 | Chang et al. |
| 7,239,475 B1 | 7/2007 | Lin et al. |
| 7,245,458 B2 | 7/2007 | Zhang et al. |
| 7,271,978 B1 | 9/2007 | Santini et al. |
| 7,274,534 B1 | 9/2007 | Choy et al. |
| 7,280,311 B1 | 10/2007 | Ou-Yang et al. |
| 7,280,317 B1 | 10/2007 | Little et al. |
| 7,280,319 B1 | 10/2007 | McNab |
| 7,292,406 B1 | 11/2007 | Huang |
| 7,298,584 B1 | 11/2007 | Yamada et al. |
| 7,298,593 B2 | 11/2007 | Yao et al. |
| 7,327,537 B1 | 2/2008 | Oveyssi |
| 7,339,268 B1 | 3/2008 | Ho et al. |
| 7,342,746 B1 | 3/2008 | Lin |
| 7,344,060 B2 | 3/2008 | Koh |
| RE40,203 E | 4/2008 | Hatch et al. |
| 7,353,524 B1 | 4/2008 | Lin et al. |
| 7,359,154 B2 | 4/2008 | Yao et al. |
| 7,369,368 B1 | 5/2008 | Mohajerani |
| 7,372,669 B2 | 5/2008 | Deguchi et al. |
| 7,372,670 B1 | 5/2008 | Oveyssi |
| 7,375,874 B1 | 5/2008 | Novotny et al. |
| 7,375,929 B1 | 5/2008 | Chang et al. |
| 7,379,266 B1 | 5/2008 | Ou-Yang et al. |
| 7,381,904 B1 | 6/2008 | Codilian |
| 7,385,784 B1 | 6/2008 | Berding et al. |
| 7,388,731 B1 | 6/2008 | Little et al. |
| 7,388,733 B2 | 6/2008 | Swanson et al. |
| 7,394,139 B2 | 7/2008 | Park et al. |
| 7,414,814 B1 | 8/2008 | Pan |
| 7,420,771 B1 | 9/2008 | Hanke et al. |
| 7,434,987 B1 | 10/2008 | Gustafson et al. |
| 7,436,625 B1 | 10/2008 | Chiou et al. |
| 7,440,234 B1 | 10/2008 | Cheng et al. |
| 7,440,236 B1 | 10/2008 | Bennin et al. |
| 7,450,346 B2 | 11/2008 | Arya et al. |
| 7,477,488 B1 | 1/2009 | Zhang et al. |
| 7,477,489 B1 | 1/2009 | Chen et al. |
| 7,482,800 B2 | 1/2009 | Ooyabu et al. |
| 7,484,291 B1 | 2/2009 | Ostrander et al. |
| 7,505,231 B1 | 3/2009 | Golgolab et al. |
| 7,515,240 B2 | 4/2009 | Lu et al. |
| 7,518,830 B1 | 4/2009 | Panchal et al. |
| 7,525,767 B2 | 4/2009 | Erpelding |
| 7,525,769 B2 | 4/2009 | Yao et al. |
| 7,529,064 B1 | 5/2009 | Huang et al. |
| 7,538,981 B1 | 5/2009 | Pan |
| 7,561,374 B1 | 7/2009 | Codilian et al. |
| 7,567,410 B1 | 7/2009 | Zhang et al. |
| 7,576,955 B1 | 8/2009 | Yang et al. |
| 7,593,181 B1 | 9/2009 | Tsay et al. |
| 7,605,999 B1 | 10/2009 | Kung et al. |
| 7,609,486 B1 | 10/2009 | Little |
| 7,610,672 B1 | 11/2009 | Liebman |
| 7,616,408 B2 | 11/2009 | Choi et al. |
| 7,633,721 B1 | 12/2009 | Little et al. |
| 7,633,722 B1 | 12/2009 | Larson et al. |
| 7,652,890 B2 | 1/2010 | Ohsawa et al. |
| 7,656,609 B1 | 2/2010 | Berding et al. |
| 7,660,075 B1 | 2/2010 | Lin et al. |
| 7,672,083 B1 | 3/2010 | Yu et al. |
| 7,684,155 B1 | 3/2010 | Huang et al. |
| 7,686,555 B1 | 3/2010 | Larson et al. |
| 7,697,102 B2 | 4/2010 | Hirakata et al. |
| 7,709,078 B1 | 5/2010 | Sevier et al. |
| 7,715,149 B1 | 5/2010 | Liebman et al. |
| 7,729,091 B1 | 6/2010 | Huang et al. |
| 7,751,145 B1 | 7/2010 | Lin et al. |
| 7,764,467 B2 | 7/2010 | Hanya et al. |
| 7,826,177 B1 | 11/2010 | Zhang et al. |
| 7,852,601 B1 | 12/2010 | Little |
| 7,864,488 B1 | 1/2011 | Pan |
| 7,876,664 B2 | 1/2011 | Tsukagoshi et al. |
| 7,898,770 B1 | 3/2011 | Zhang et al. |
| 7,903,369 B1 | 3/2011 | Codilian et al. |
| 7,907,369 B1 | 3/2011 | Pan |
| 7,911,742 B1 | 3/2011 | Chang et al. |
| 7,926,167 B1 | 4/2011 | Liebman et al. |
| 7,957,095 B1 | 6/2011 | Tsay et al. |
| 7,957,102 B1 | 6/2011 | Watson et al. |
| 7,961,436 B1 | 6/2011 | Huang et al. |
| 8,004,782 B1 | 8/2011 | Nojaba et al. |
| 8,009,384 B1 | 8/2011 | Little |
| 8,015,692 B1 | 9/2011 | Zhang et al. |
| 8,018,687 B1 | 9/2011 | Little et al. |
| 8,030,576 B2 | 10/2011 | Kamei et al. |
| 8,031,431 B1 | 10/2011 | Berding et al. |
| 8,064,168 B1 | 11/2011 | Zhang et al. |
| 8,064,170 B1 | 11/2011 | Pan |
| 8,068,314 B1 | 11/2011 | Pan et al. |
| 8,081,401 B1 | 12/2011 | Huang et al. |
| 8,100,017 B1 | 1/2012 | Blick et al. |
| 8,111,483 B2 | 2/2012 | Arai |
| 8,116,038 B1 | 2/2012 | Zhang et al. |
| 8,120,872 B2 | 2/2012 | Sekii et al. |
| 8,125,740 B1 | 2/2012 | Yang et al. |
| 8,142,671 B1 | 3/2012 | Pan |
| 8,156,633 B1 | 4/2012 | Foisy |
| 8,159,785 B1 | 4/2012 | Lee et al. |
| 8,169,746 B1 | 5/2012 | Rice et al. |
| 8,189,298 B1 | 5/2012 | Lee et al. |
| 8,194,348 B2 | 6/2012 | Jacoby et al. |
| 8,194,354 B1 | 6/2012 | Zhang et al. |
| 8,194,355 B1 | 6/2012 | Pan et al. |
| 8,203,806 B2 | 6/2012 | Larson et al. |
| 8,223,453 B1 | 7/2012 | Norton et al. |
| 8,228,631 B1 | 7/2012 | Tsay et al. |
| 8,233,239 B1 | 7/2012 | Teo et al. |
| 8,248,733 B1 | 8/2012 | Radavicius et al. |
| 8,259,417 B1 | 9/2012 | Ho et al. |
| 8,274,760 B1 | 9/2012 | Zhang et al. |

(56) References Cited

U.S. PATENT DOCUMENTS

| | | |
|---|---|---|
| 8,276,256 B1 | 10/2012 | Zhang et al. |
| 8,279,560 B1 | 10/2012 | Pan |
| 8,284,514 B1 | 10/2012 | Garbarino |
| 8,289,646 B1 | 10/2012 | Heo et al. |
| 8,295,013 B1 | 10/2012 | Pan et al. |
| 8,295,014 B1 | 10/2012 | Teo et al. |
| 8,300,352 B1 | 10/2012 | Larson et al. |
| 8,305,708 B2 | 11/2012 | Tacklind |
| 8,320,084 B1 | 11/2012 | Shum et al. |
| 8,320,086 B1 | 11/2012 | Moradnouri et al. |
| 8,322,021 B1 | 12/2012 | Berding et al. |
| 8,325,446 B1 | 12/2012 | Liu et al. |
| 8,325,447 B1 | 12/2012 | Pan |
| 8,339,748 B2 | 12/2012 | Shum et al. |
| 8,345,387 B1 | 1/2013 | Nguyen |
| 8,363,351 B1 | 1/2013 | Little |
| 8,363,353 B2 | 1/2013 | Yawata |
| 8,369,044 B2 | 2/2013 | Howie et al. |
| 8,411,389 B1 | 4/2013 | Tian et al. |
| 8,416,522 B1 | 4/2013 | Schott et al. |
| 8,416,524 B2 | 4/2013 | Saichi et al. |
| 8,416,534 B1 | 4/2013 | Heo et al. |
| 8,422,171 B1 | 4/2013 | Guerini |
| 8,422,175 B1 | 4/2013 | Oveyssi |
| 8,432,641 B1 | 4/2013 | Nguyen |
| 8,437,101 B1 | 5/2013 | German et al. |
| 8,438,721 B1 | 5/2013 | Sill |
| 8,446,688 B1 | 5/2013 | Quines et al. |
| 8,451,559 B1 | 5/2013 | Berding et al. |
| 8,467,153 B1 | 6/2013 | Pan et al. |
| 8,472,131 B1 | 6/2013 | Ou-Yang et al. |
| 8,477,459 B1 | 7/2013 | Pan |
| 8,477,460 B1 | 7/2013 | Liebman |
| 8,488,270 B2 | 7/2013 | Brause et al. |
| 8,488,280 B1 | 7/2013 | Myers et al. |
| 8,499,652 B1 | 8/2013 | Tran et al. |
| 8,514,514 B1 | 8/2013 | Berding et al. |
| 8,530,032 B1 | 9/2013 | Sevier et al. |
| 8,542,465 B2 | 9/2013 | Liu et al. |
| 8,547,664 B1 | 10/2013 | Foisy et al. |
| 8,553,356 B1 | 10/2013 | Heo et al. |
| 8,553,366 B1 | 10/2013 | Hanke |
| 8,553,367 B1 | 10/2013 | Foisy et al. |
| 8,564,909 B1 | 10/2013 | Dunn et al. |
| 8,611,052 B1 | 12/2013 | Pan et al. |
| 8,616,900 B1 | 12/2013 | Lion |
| 8,665,555 B1 | 3/2014 | Young et al. |
| 8,665,566 B1 | 3/2014 | Pan et al. |
| 8,667,667 B1 | 3/2014 | Nguyen et al. |
| 8,693,139 B2 | 4/2014 | Tian et al. |
| 8,693,140 B1 | 4/2014 | Weiher et al. |
| 8,699,179 B1 | 4/2014 | Golgolab et al. |
| 8,702,998 B1 | 4/2014 | Guerini |
| 8,705,201 B2 | 4/2014 | Casey et al. |
| 8,705,209 B2 | 4/2014 | Seymour et al. |
| 8,711,521 B2 | 4/2014 | Feng et al. |
| 8,717,706 B1 | 5/2014 | German et al. |
| 8,743,509 B1 | 6/2014 | Heo et al. |
| 8,755,148 B1 | 6/2014 | Howie et al. |
| 8,756,776 B1 | 6/2014 | Chen et al. |
| 8,760,800 B1 | 6/2014 | Brown et al. |
| 8,760,812 B1 | 6/2014 | Chen et al. |
| 8,760,814 B1 | 6/2014 | Pan et al. |
| 8,760,816 B1 | 6/2014 | Myers et al. |
| 8,773,812 B1 | 7/2014 | Gustafson et al. |
| 8,780,491 B1 | 7/2014 | Perlas et al. |
| 8,780,504 B1 | 7/2014 | Teo et al. |
| 8,792,205 B1 | 7/2014 | Boye-Doe et al. |
| 8,797,677 B2 | 8/2014 | Heo et al. |
| 8,797,689 B1 | 8/2014 | Pan et al. |
| 8,824,095 B1 | 9/2014 | Dougherty |
| 8,824,098 B1 | 9/2014 | Huang et al. |
| 2001/0017749 A1 | 8/2001 | Stefansky |
| 2005/0030670 A1 | 2/2005 | Ando et al. |
| 2005/0243472 A1 | 11/2005 | Kamigama et al. |
| 2006/0098347 A1 | 5/2006 | Yao et al. |
| 2006/0146262 A1 | 7/2006 | Yu et al. |
| 2006/0157869 A1 | 7/2006 | Huang et al. |
| 2007/0227768 A1* | 10/2007 | Shin .............. G11B 5/4846 |
| 2007/0246251 A1 | 10/2007 | Shiraishi et al. |
| 2008/0002303 A1 | 1/2008 | Wang et al. |
| 2008/0005896 A1* | 1/2008 | Yeh et al. ......... Y10T 29/49124 |
| 2008/0068757 A1 | 3/2008 | Kamigama et al. |
| 2008/0088975 A1 | 4/2008 | Bennin et al. |
| 2008/0225439 A1 | 9/2008 | Komura |
| 2009/0151994 A1 | 6/2009 | Ohsawa et al. |
| 2009/0207529 A1 | 8/2009 | Yao |
| 2009/0211789 A1 | 8/2009 | Yeates et al. |
| 2009/0253233 A1 | 10/2009 | Chang et al. |
| 2010/0007993 A1 | 1/2010 | Contreras et al. |
| 2010/0118444 A1 | 5/2010 | Rothenberg et al. |
| 2010/0176827 A1 | 7/2010 | Yamazaki et al. |
| 2010/0188778 A1 | 7/2010 | Castagna |
| 2010/0195474 A1 | 8/2010 | Tsukuda et al. |
| 2010/0220414 A1 | 9/2010 | Klarqvist et al. |
| 2011/0122530 A1 | 5/2011 | Sekii et al. |
| 2011/0212281 A1 | 9/2011 | Jacoby et al. |
| 2011/0317309 A1 | 12/2011 | Shum et al. |
| 2012/0067626 A1 | 3/2012 | Mizutani |
| 2012/0200957 A1 | 8/2012 | Yawata |
| 2013/0038964 A1 | 2/2013 | Garbarino et al. |
| 2013/0050872 A1 | 2/2013 | Sekii et al. |
| 2013/0091698 A1 | 4/2013 | Banshak, Jr. et al. |
| 2013/0155546 A1 | 6/2013 | Heo et al. |
| 2013/0290988 A1 | 10/2013 | Watson et al. |

OTHER PUBLICATIONS

Notice of Allowance dated May 21, 2012 from U.S. Appl. No. 13/164,936, 17 pages.

Notice of Allowance dated May 21, 2012 from U.S. Appl. No. 13/398,578, 16 pages.

Notice of Allowance dated May 29, 2012 from U.S. Appl. No. 13/164,959, 17 pages.

Notice of Allowance dated Feb. 20, 2013 from U.S. Appl. No. 12/916,237, 7 pages.

Office Action dated May 22, 2012 from U.S. Appl. No. 12/916,237, 8 pages.

* cited by examiner

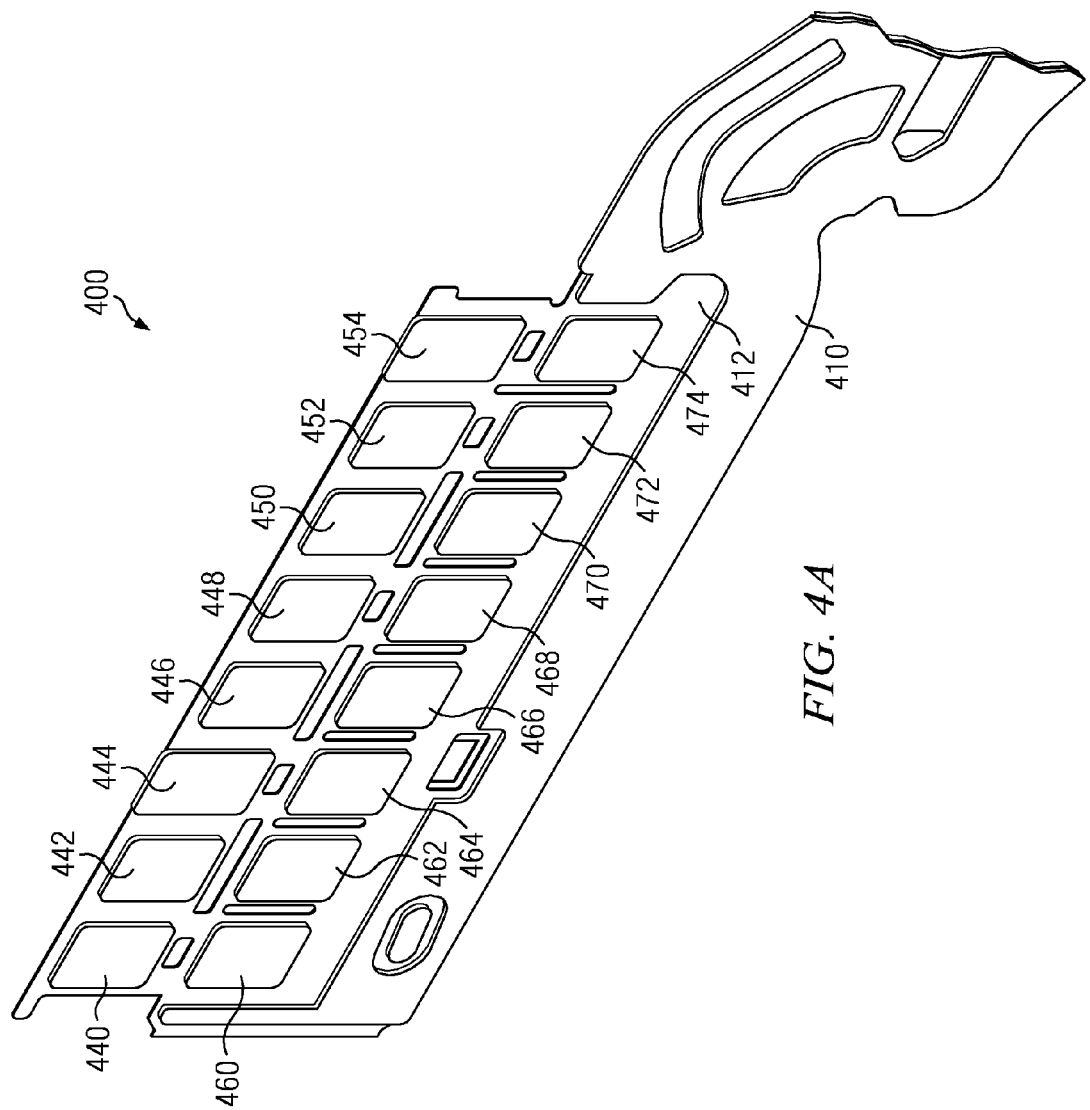

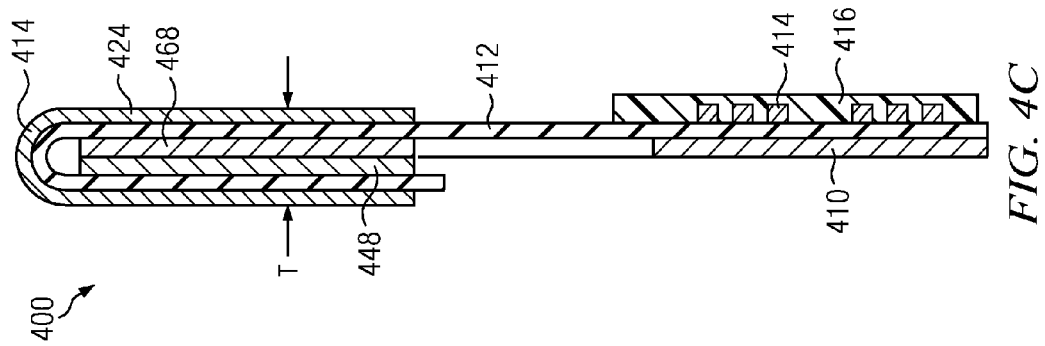
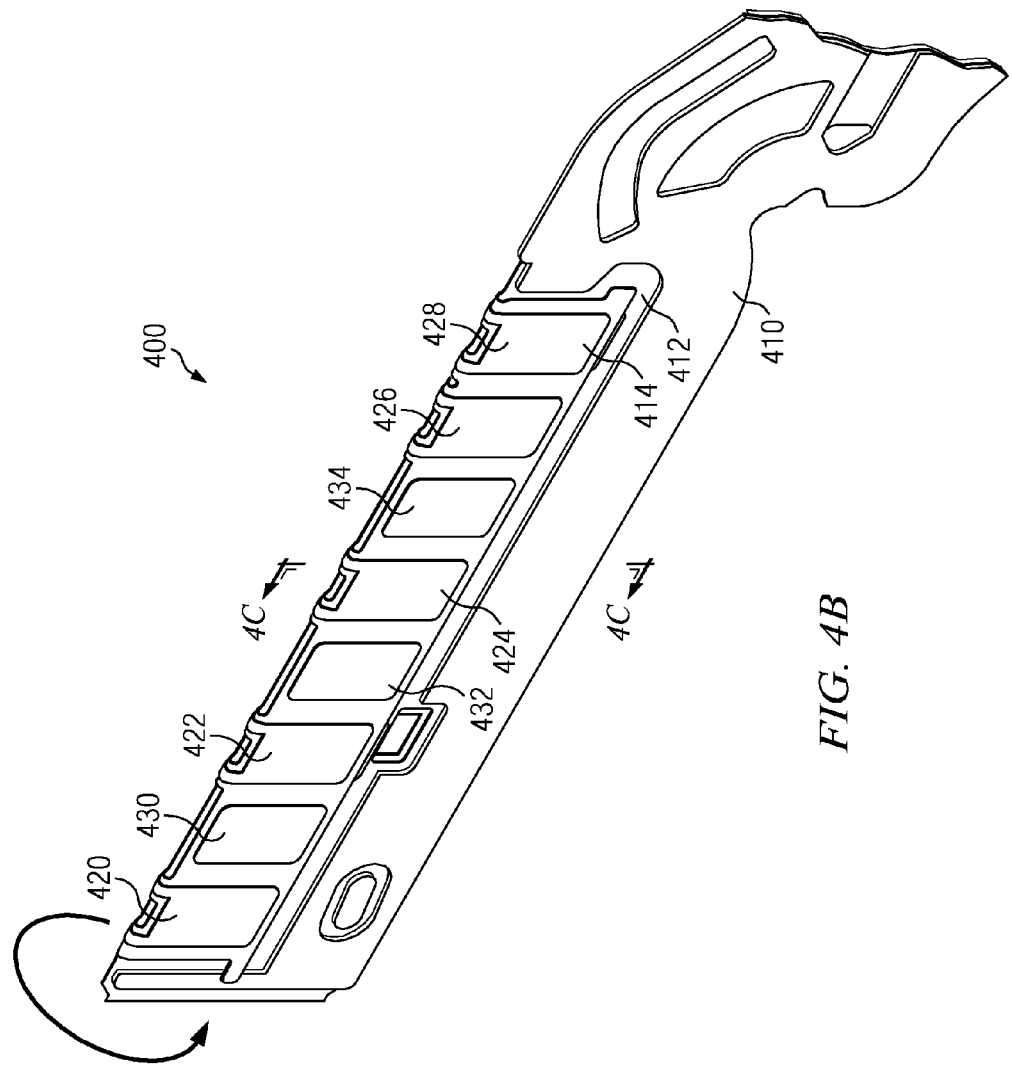
FIG. 4C
FIG. 4B

METHOD OF MANUFACTURING A DISK DRIVE HEAD GIMBAL ASSEMBLY HAVING A FLEXURE TAIL WITH FOLDED BOND PADS

CROSS-REFERENCE TO RELATED APPLICATIONS

This Application is a divisional of U.S. patent application Ser. No. 12/916,237, filed on Oct. 29, 2010, entitled "DISK DRIVE HEAD GIMBAL ASSEMBLY HAVING A FLEXURE TAIL WITH FOLDED BOND PADS," now issued as U.S. Pat. No. 8,467,153, which is hereby incorporated by reference in its entirety.

BACKGROUND

Information storage devices are used to retrieve and/or store data in computers and other consumer electronics devices. A magnetic hard disk drive is an example of an information storage device that includes one or more heads that can both read and write, but other information storage devices also include heads—sometimes including heads that cannot write.

In a modern magnetic hard disk drive device, each head is a sub-component of a head-gimbal assembly (HGA) that typically includes a laminated flexure to carry the electrical signals to and from the head. The HGA, in turn, is a sub-component of a head-stack assembly (HSA) that typically includes a plurality of HGAs, an actuator, and a flexible printed circuit (FPC). The plurality of HGAs are attached to various arms of the actuator.

Modern laminated flexures typically include conductive copper traces that are isolated from a stainless steel structural layer by a polyimide dielectric layer. So that the signals from/to the head can reach the FPC on the actuator body, each HGA flexure includes a flexure tail that extends away from the head along a corresponding actuator arm and ultimately attaches to the FPC adjacent the actuator body. That is, the flexure includes traces that extend from adjacent the head and continue along the flexure tail to electrical connection points. The FPC includes conductive electrical terminals that correspond to the electrical connection points of the flexure tail.

To facilitate electrical connection of the conductive traces of the flexure tails to the conductive electrical terminals of the FPC during the HSA manufacturing process, the flexure tails must first be properly positioned relative to the FPC so that the conductive traces of the flexure tails are aligned with the conductive electrical terminals of the FPC. Then the flexure tails must be held or constrained against the conductive electrical terminals of the FPC while the aforementioned electrical connections are made (e.g. by ultrasonic bonding, solder jet bonding, or solder bump reflow).

However, recently for some disk drive products, the aforementioned electrical connections may employ a type of anisotropic conductive film (ACF) bonding. An anisotropic conductive film is typically an adhesive doped with conductive beads or cylindrical particles of uniform or similar diameter. As the doped adhesive is compressed and cured, it is squeezed between the surfaces to be bonded with sufficient uniform pressure that a single layer of the conductive beads makes contact with both surfaces to be bonded. In this way, the thickness of the adhesive layer between the bonded surfaces becomes approximately equal to the size of the conductive beads. The cured adhesive film may conduct electricity via the contacting beads in a direction normal to the bonded surfaces (though may not necessarily conduct electricity parallel to the bonded surfaces, since the beads may not touch each other laterally—though axially each bead is forced to contact both of the surfaces to be bonded—hence the term "anisotropic").

Maintaining sufficient uniform pressure during adhesive curing, such that a single layer of conductive beads in an ACF makes contact with both opposing surfaces to be bonded, may be achievable for existing HGA designs using a tool that presses only upon a single bond pad. However, in a high-volume manufacturing environment like that necessitated by the very competitive information storage device industry, there is a practical requirement for fast, cost-effective, and robust bonding of many bond pads simultaneously; bonding one bond pad at a time simply takes too much time.

Accordingly, there is a need in the art for an improved HGA design that may facilitate the application of more uniform pressure to groups of bond pads, to more quickly accomplish reliable electrical connection of the conductive traces of a flexure tail to the conductive electrical terminals of a FPC (e.g. by ACF or by any other bonding method that benefits from a more uniform bonding pressure) during HSA manufacture.

BRIEF DESCRIPTION OF THE DRAWINGS

FIG. 4A depicts a flexure tail terminal region before folding, according to an embodiment of the present invention.

FIG. 4B depicts a flexure tail terminal region after folding, according to an embodiment of the present invention.

FIG. 4C depicts a cross-section of the folded flexure tail terminal region of FIG. 4B.

DESCRIPTION OF THE PREFERRED EMBODIMENTS

Figure 1:
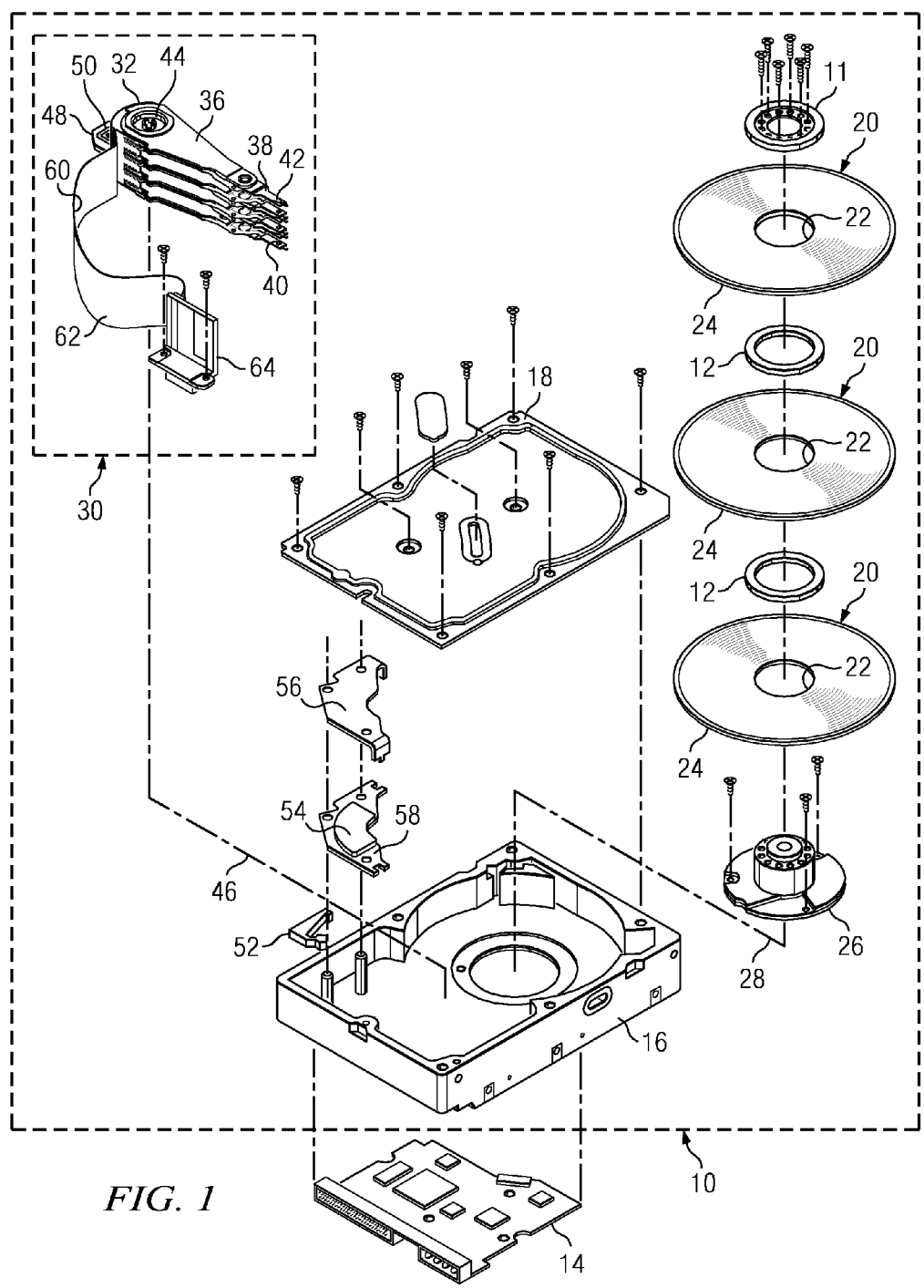
FIG. 1 is an exploded perspective view of a disk drive according to an embodiment of the present invention.

FIG. 1 is an exploded perspective view of a disk drive according to an example embodiment of the present invention. The disk drive includes a head disk assembly (HDA) 10 and a printed circuit board assembly (PCBA) 14. The HDA 10 includes a base 16 and cover 18 that together house at least one annular magnetic disk 20. Each disk 20 contains a plurality of magnetic tracks for storing data. The tracks are disposed upon opposing first and second disk surfaces of the disk 20 that extend between an inner disk edge 22 (corresponding to the inner diameter) and an outer disk edge 24 (corresponding to the outer diameter) of the disk 20. The head disk assembly 10 further includes a spindle motor 26 for rotating the disk 20 about a disk axis of rotation 28. The spindle motor 26 includes a spindle motor hub that is rotatably attached to the base 16 of the HDA 10. Disks 20 may be stacked and separated with one or more annular disk spacers 12 that are disposed about the hub, all held fixed to the hub by disk clamp 11.

The HDA 10 further includes a head stack assembly (HSA) 30 rotatably attached to the base 16 of HDA 10. The HSA 30 includes an actuator comprising an actuator body 32 and one or more actuator arms 36 extending from the actuator body 32. The actuator body 32 includes a bore 44 and a pivot bearing cartridge engaged within the bore for facilitating the HSA 30 to rotate relative to HDA 10 about actuator pivot axis 46. One or two head gimbal assemblies (HGA) 38 are attached to a distal end of each actuator arm 36. Each HGA includes a head (e.g. head 40) for reading and writing data from and to the disk 20, and a load beam 42 to compliantly preload the head against the disk 20. The HSA 30 further includes a coil support 48 that extends from one side of the HSA 30 that is opposite head 40. The coil support 48 is configured to support a coil 50 through which a changing electrical current is passed. The coil 50 interacts with one or more magnets 54 that are attached to base 16 via a yoke structure 56, 58 to form a voice coil motor for controllably rotating the HSA 30. HDA 10 includes a latch 52 rotatably mounted on base 16 to prevent undesired rotations of HSA 30.

The PCBA 14 includes a servo control system for generating servo control signals to control the current through the coil 50 and thereby position the HSA 30 relative to tracks disposed upon surfaces of disk 20. The HSA 30 is electrically connected to PCBA 14 via a flexible printed circuit (FPC) 60, which includes a flex cable 62 and a flex cable support bracket 64. The flex cable 62 supplies current to the coil 50 and carries signals between the HSA 30 and the PCBA 14.

In the magnetic hard disk drive of FIG. 1, the head 40 includes a body called a "slider" that carries a magnetic transducer on its trailing end (not visible given the scale of FIG. 1). The magnetic transducer may include an inductive write element and a magnetoresistive read element. During operation the transducer is separated from the magnetic disk by a very thin hydrodynamic air bearing. As the motor 26 rotates the magnetic disk 20, the hydrodynamic air bearing is formed between an air bearing surface of the slider of head 40, and a surface of the magnetic disk 20. The thickness of the air bearing at the location of the transducer is commonly referred to as "flying height."

Figure 2:
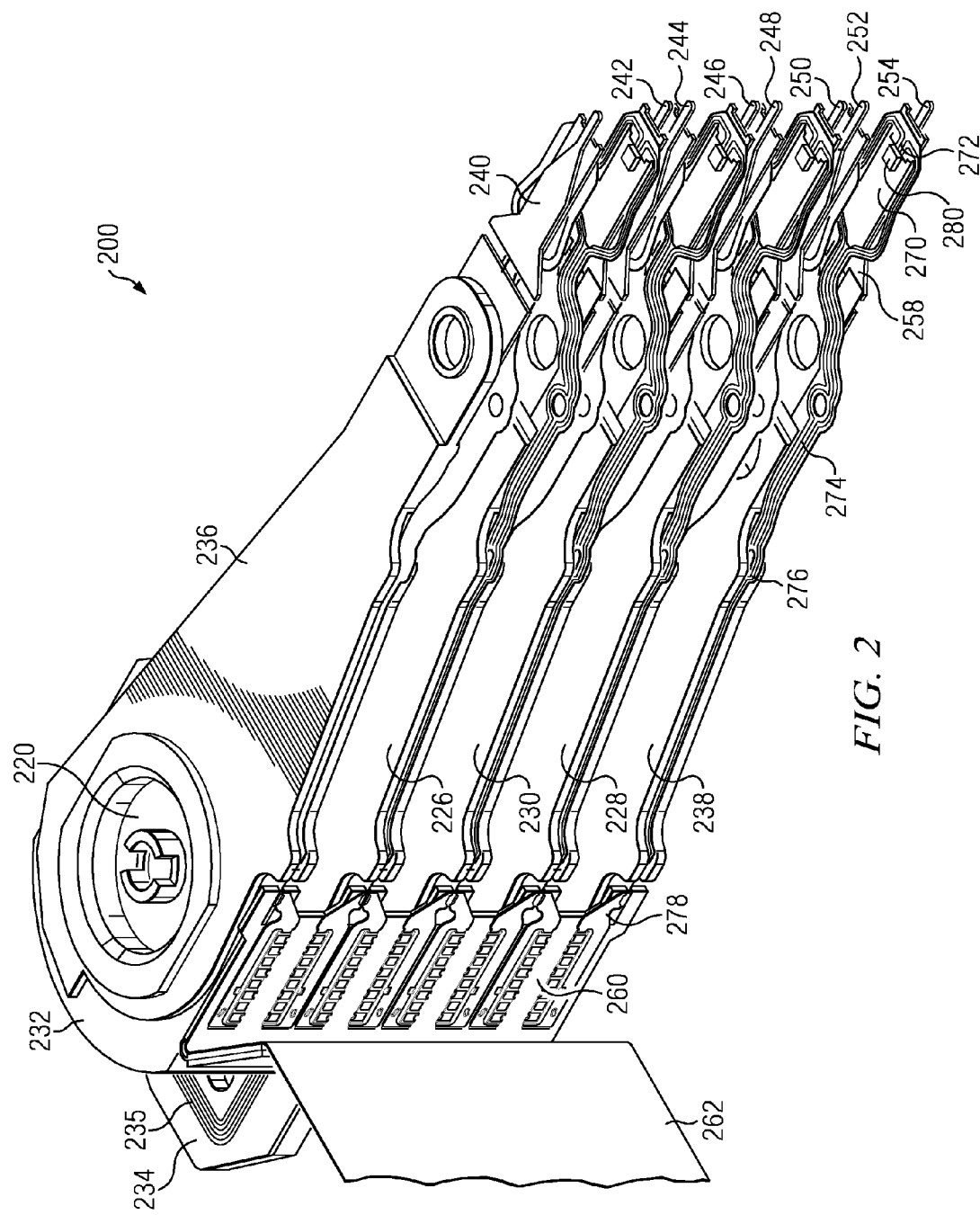
FIG. 2 is a perspective view of a head stack assembly (HSA) according to an embodiment of the present invention.

FIG. 2 is a perspective view of a head stack assembly (HSA) 200 according to an example embodiment of the present invention. The HSA 200 includes an actuator body 232 and a plurality of actuator arms 226, 228, 230, 236, 238 extending from the actuator body 232. The actuator body 232 includes a pivot bearing cartridge 220 disposed in the actuator bore, and a coil support 234 that supports a coil 235 and extends from the actuator body 232 in a direction that is generally opposite the actuator arms 226, 228, 230, 236, 238. The HSA 200 also includes a plurality of head gimbal assemblies (HGA) 240, 242, 244, 246, 248, 250, 252, 254, attached to the actuator arms 226, 228, 230, 236, 238. For example, such attachment may be made by swaging. Note that each of the inner actuator arms 226, 228, 230 includes two HGAs, while each of the outer actuator arms 236, 238, includes only one HGA. This is because in a fully populated disk drive the inner arms are positioned between disk surfaces while the outer actuator arms are positioned over (or under) a single disk surface. In a depopulated disk drive, however, any of the actuator arms may have one or zero HGAs, possibly replaced by a dummy mass.

Each HGA includes a head for reading and/or writing to an adjacent disk surface (e.g. HGA 254 includes head 280). The head 280 is attached to a tongue portion 272 of a laminated flexure 270. The laminated flexure 270 is part of the HGA 254, and is attached to a load beam 258 (another part of the HGA 254). The laminated flexure 270 may include a structural layer (e.g. stainless steel), a dielectric layer (e.g. polymide), and a conductive layer into which traces are patterned (e.g. copper). The HSA 200 also includes a flexible printed circuit (FPC) 260 adjacent the actuator body 232, and the FPC 260 includes a flex cable 262. The FPC 260 may comprise a laminate that includes two or more conventional dielectric and conductive layer materials (e.g. one or more polymeric materials, copper, etc). The laminated flexure 270 includes a flexure tail 274 that includes an intermediate region 276 that is disposed adjacent the actuator arm 238, and a terminal region 278 that is electrically connected to bond pads of the FPC 260.

Methods of electrical connection of the flexure tails to the FPC 260 include solder reflow, solder ball jet (SBJ), and anisotropic conductive film (ACF) bonding, and are preferably but not necessarily automated. To electrically connect and securely attach the flexure tails to the FPC 260, the flexure tails are first aligned with the FPC 260, and then pressed against the FPC 260 (at least temporarily) while electrical connection is established and secure attachment is completed. Maintaining sufficient uniform pressure to groups of bond pads may be desirable during this process, and may be facilitated by certain inventive structural features in the terminal regions of the flexure tails.

Figure 3A:
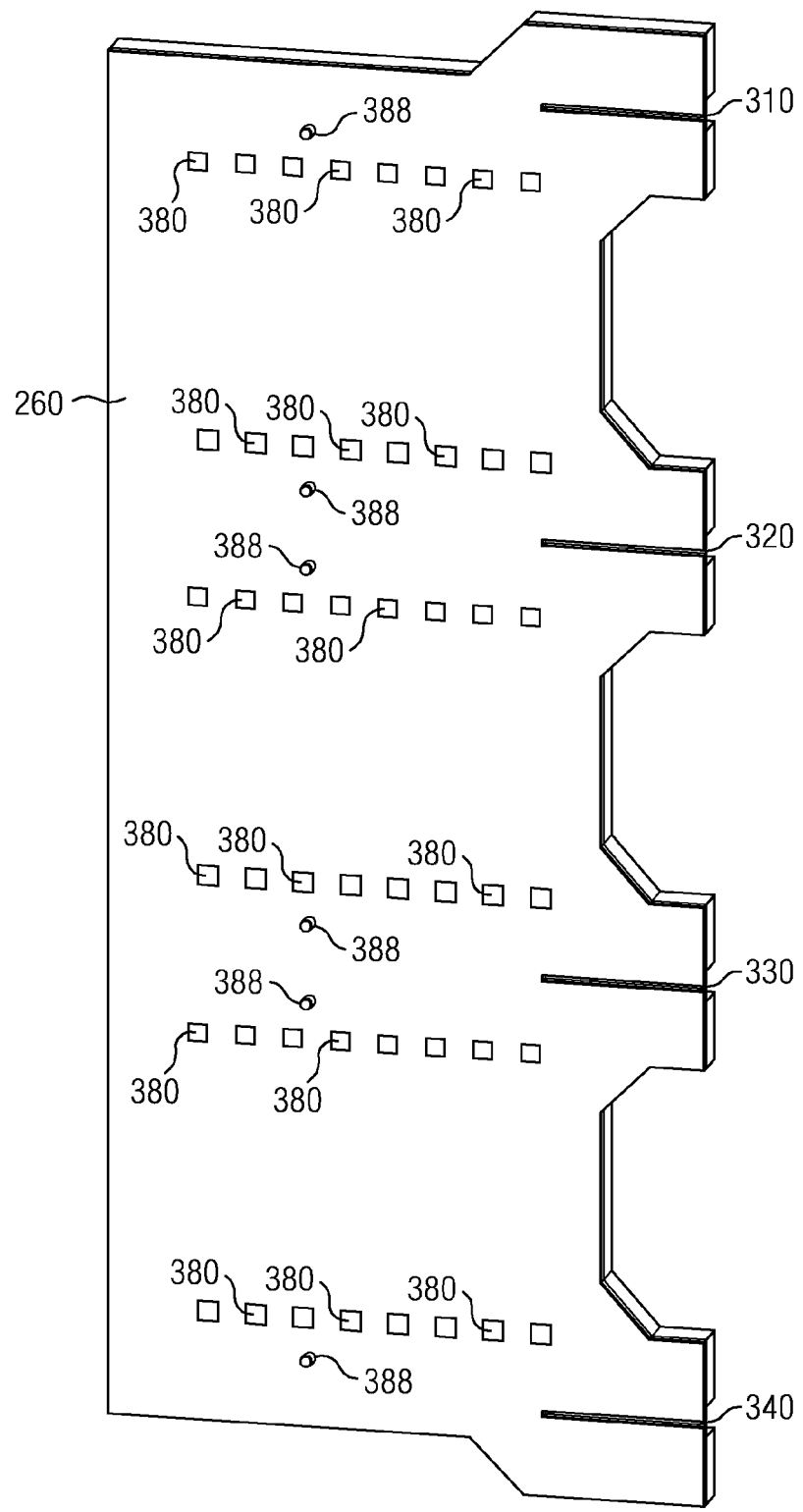
FIG. 3A is a perspective view of a portion of a flexible printed circuit (FPC) according to an embodiment of the present invention.
Figure 3B:
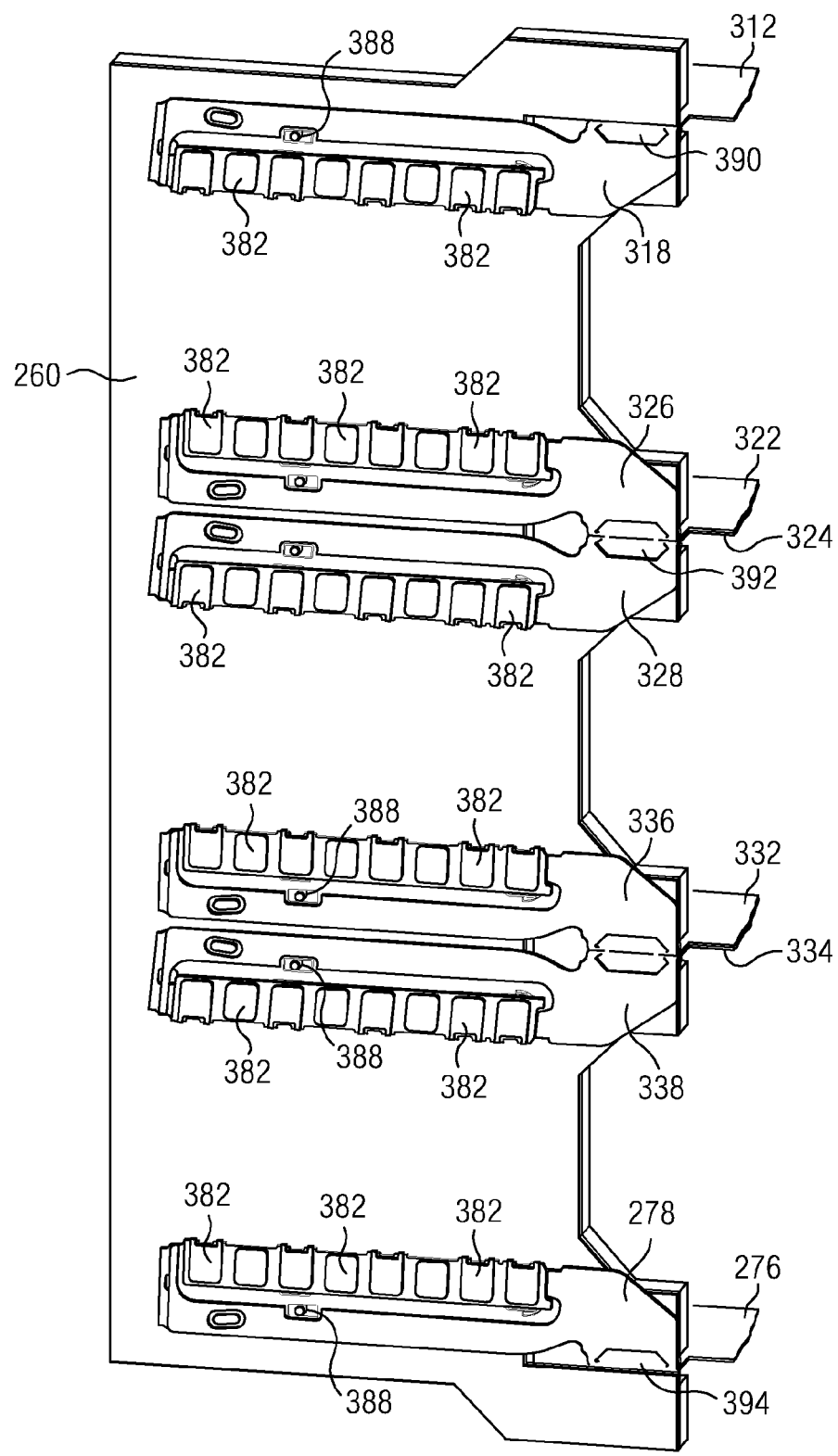
FIG. 3B is a perspective view of a plurality of flexure tail terminal regions attached to the FPC portion of FIG. 3A, according to an embodiment of the present invention.

For example, FIG. 3B is a perspective view of a plurality of flexure tail terminal regions 278, 318, 326, 328, 336, 338 that are electrically connected to the FPC 260, according to an embodiment of the present invention. FIG. 3A depicts the FPC 260 before the flexure tail terminal regions 278, 318, 326, 328, 336, 338 are bonded thereto. Now referring to FIGS. 3A and 3B, the FPC 260 includes electrical conduits that terminate at FPC bond pads 380 which are aligned with and connected to flexure bond pads 382 of the terminal regions 278, 318, 326, 328, 336, 338 of the HGA flexure tails.

As shown in FIG. 3B, each of the flexure tail terminal regions 278, 318, 326, 328, 336, 338 optionally includes an alignment hole to accommodate the alignment posts 388. Moreover, each of the flexure tail intermediate regions 276, 312, 322, 324, 332, 334 may extend into one of the slits 310, 320, 330, 340. Note that in the example embodiment of FIGS. 3A-B, each of the flexure tails is bent near a corresponding slit so that each of the flexure tail terminal regions 278, 318, 326, 328, 336, 338 is substantially orthogonal to the intermediate region 276, 312, 322, 324, 332, 334 of the same flexure tail. In the embodiment of FIG. 3B, such bending may be facilitated by an optional hexagonal opening (e.g. hexagonal opening 390, 392, or 394) extending through each of the flexure tails that is depicted.

FIG. 4A depicts a close up perspective view of a flexure tail terminal region 400 of a laminate flexure, before its bond pads are folded upon themselves according to an example embodiment of the present invention. FIG. 4B shows the flexure tail terminal region 400 after its bond pads are folded upon themselves, and FIG. 4C depicts a cross section of FIG. 4B. Now referring additionally to FIGS. 4A-C, the flexure tail terminal region 400 of the laminate flexure comprises a structural layer 410, a dielectric layer 412, and a conductive layer 414. In certain embodiments, the structural layer 410 comprises stainless steel, the dielectric layer 412 comprises polyimide, and the conductive layer 414 comprises copper, for example, though it is contemplated that other materials providing similar function might be used instead. Certain embodiments optionally further comprise an insulative cover layer 416 (e.g. a polymeric material), that covers and insulates portions of the conductive layer 414.

The flexure tail terminal region 400 includes a plurality of flexure bond pads 420, 422, 424, 426, 428, each of which aligned with a corresponding one of the plurality of FPC bond pads 380. The flexure tail terminal region 400 also includes flexure bond pads 430, 432, 434, which are also aligned with corresponding ones of the plurality of FPC bond pads 380. Each of the plurality of flexure bond pads 420, 422, 424, 426, 428, 430, 432, and 434 is folded upon itself. In certain embodiments, folding each of the plurality of flexure bond pads 420, 422, 424, 426, 428, 430, 432, and 434 upon itself comprises simultaneously folding all of the plurality of flexure bond pads 420, 422, 424, 426, 428, 430, 432, and 434 by folding the terminal region 400 of the flexure tail upon itself. In an alternative embodiment, one or more individual bond pads may be folded non-simultaneously with others. In certain embodiments of the present invention, the folding of the flexure tail terminal region 400 at the bond pad locations may precede alignment with the FPC bond pads 380, whereas in other embodiments alignment with FPC bond pads 380 may precede folding.

Before folding, the flexure bond pads 420, 422, 424, 426, 428, 430, 432, and 434 are not visible in FIG. 4A because they are disposed on the side of the flexure tail terminal region 400 that is facing away from the viewer. After folding, portions of the flexure bond pads 420, 422, 424, 426, 428, 430, 432, and 434 are visible in FIG. 4B. In the case of flexure bond pads 420, 422, 424, 426, 428, the portions depicted in FIG. 4B are shown to be electrically continuous with corresponding portions (on the side of the flexure tail terminal region 400 that is facing away from the viewer) that would be electrically connected to the FPC bond pads 380. In the case of flexure bond pads 430, 432, and 434, however, the portions depicted in FIG. 4B are shown to be electrically discontinuous with portions (on the side of the flexure tail terminal region 400 that is facing away from the viewer) that would be electrically connected to the FPC bond pads 380.

In the embodiment of FIGS. 4A-C, a plurality of backing plates 440, 442, 444, 446, 448, 450, 452, 454, 460, 462, 464, 466, 468, 470, 472, and 474 are defined in the structural layer 410 and are disposed in general alignment with corresponding flexure bonding pads. For example, a pair of backing plates 440, 460 are disposed in general alignment with bond pad 420. Likewise, a pair of backing plates 442, 462 are disposed in general alignment with bond pad 430. As shown best in FIG. 4C, upon folding, the two backing plates (e.g. 448, 468) of each backing plate pair may be brought into facing contact with each other to increase the thickness of the folded flexure tail terminal region 400 at the locations of the bond pads (e.g. at the location of the flexure bond pad 424).

For example, as shown in FIG. 4C, the laminate flexure may define a total folded thickness T at each of the plurality of flexure bond pads that is at twice a thickness of the structural layer, plus twice a thickness of the dielectric layer, plus twice a thickness of the conductive layer (or more, e.g. if surface irregularities, contaminates, and/or additional layers are present). For example, the thickness of the structural layer may be less than 20 microns, the thickness of the dielectric layer may be less than 15 microns, the thickness of the conductive layer may be less than 15 microns, and yet the total folded thickness T may be at least 60 microns.

Figure 5A:
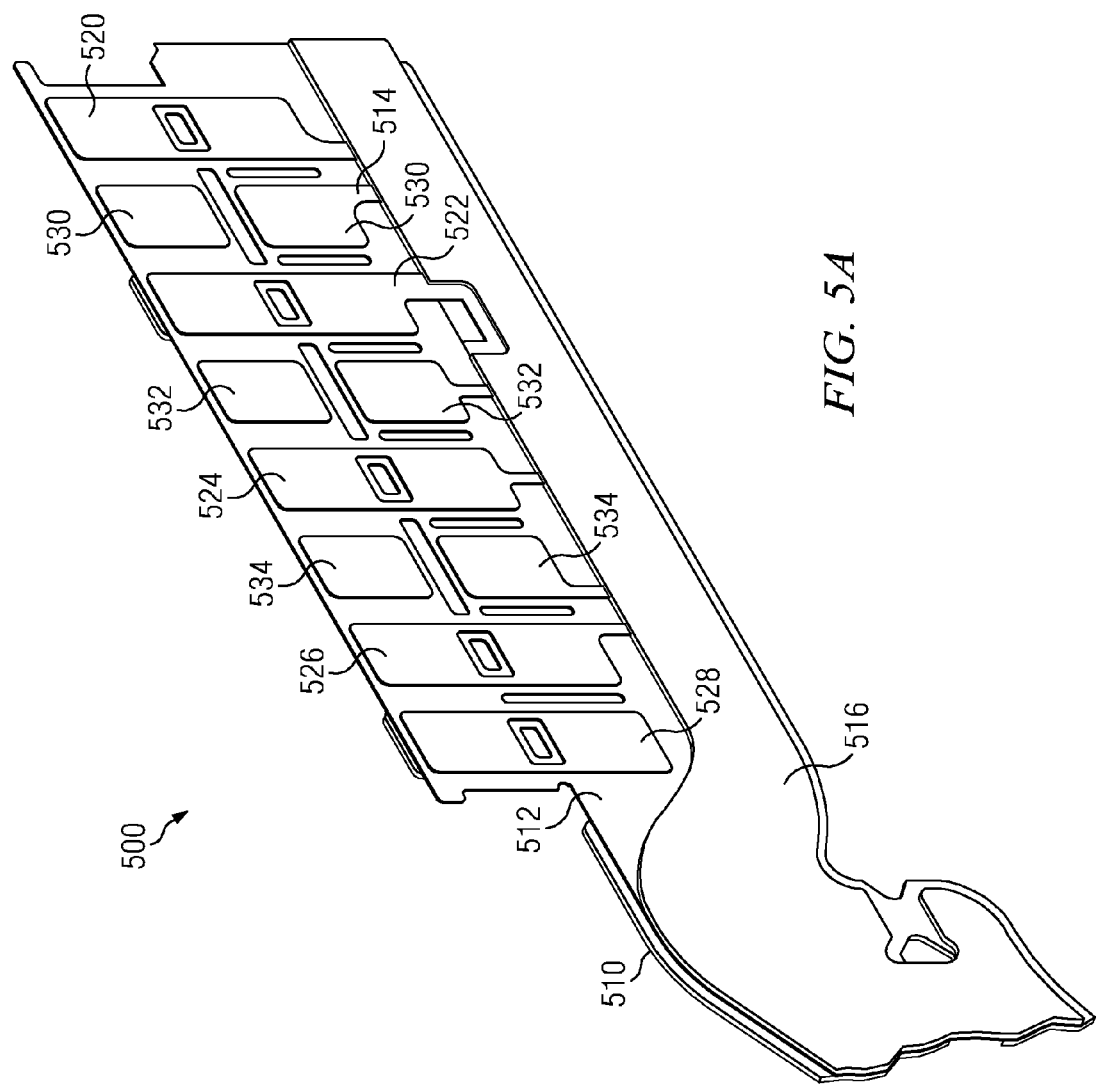
FIG. 5A depicts a flexure tail terminal region before folding, according to an embodiment of the present invention.
Figure 5B:
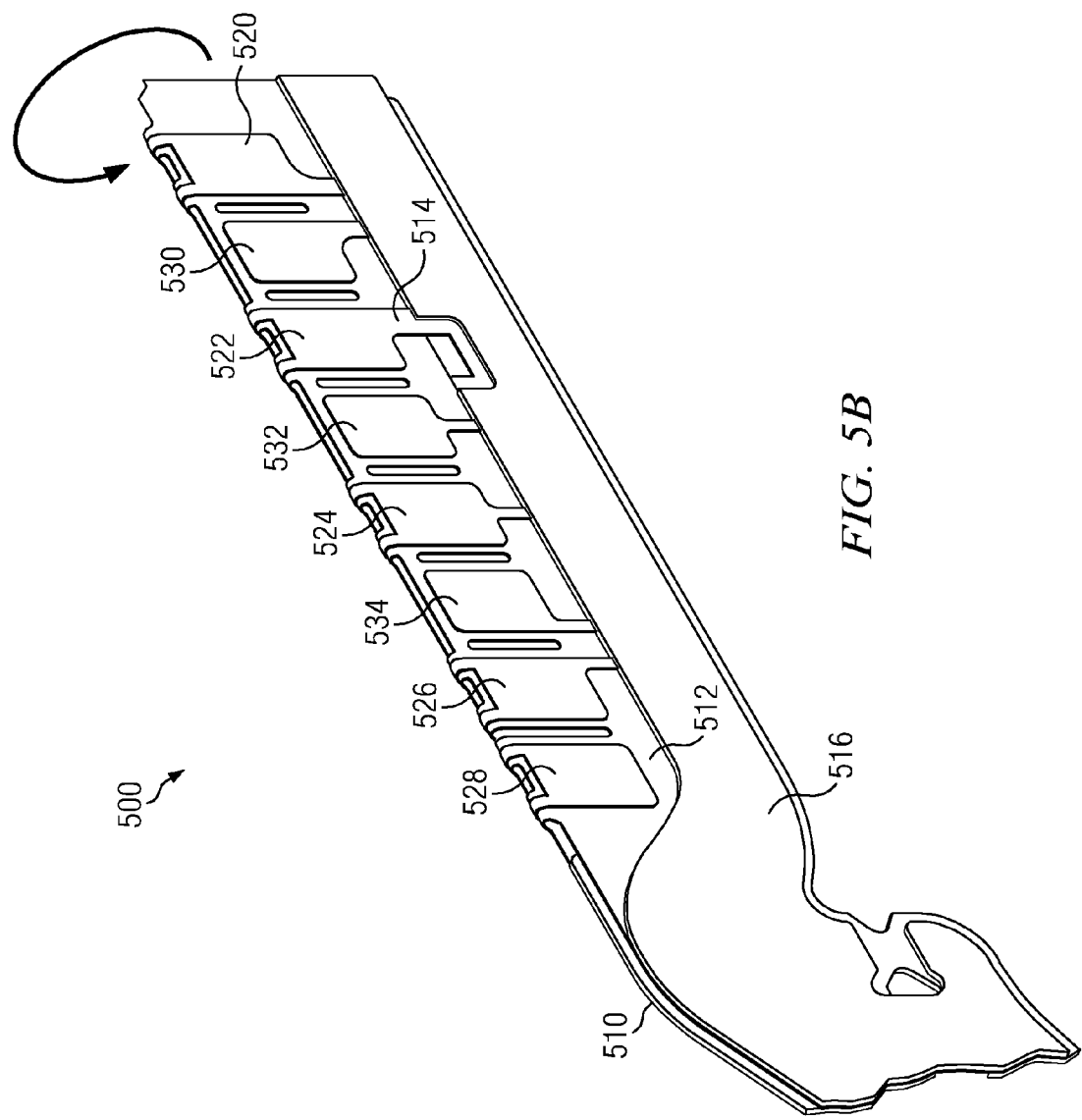
FIG. 5B depicts a flexure tail terminal region after folding, according to an embodiment of the present invention.

FIG. 5A depicts a close up perspective view of a flexure tail terminal region 500 of a laminate flexure, before its bond pads are folded upon themselves according to an example embodiment of the present invention. FIG. 5B shows the flexure tail terminal region 500 after its bond pads are folded upon themselves. Now referring additionally to FIGS. 5A-B, the flexure tail terminal region 500 of the laminate flexure comprises a structural layer 510, a dielectric layer 512, and a conductive layer 514. In certain embodiments, the structural layer 510 comprises stainless steel, the dielectric layer 512 comprises polyimide, and the conductive layer 514 comprises copper, for example, though it is contemplated that other materials providing similar function might be used instead. Certain embodiments optionally further comprise an insulative cover layer 516 (e.g. a polymeric material), that covers and insulates portions of the conductive layer 514.

The flexure tail terminal region 500 includes a plurality of flexure bond pads 520, 522, 524, 526, 528, each of which aligned with a corresponding one of the plurality of FPC bond pads 380. The flexure tail terminal region 500 also includes flexure bond pads 530, 532, 534, which are also aligned with corresponding ones of the plurality of FPC bond pads 380. Each of the plurality of flexure bond pads 520, 522, 524, 526, 528, 530, 532, and 534 is folded upon itself.

Before folding, flexure bond pads 520, 522, 524, 526, 528, 530, 532, and 534 are fully visible in FIG. 5A. That is, in FIG. 5A, both the upper portions and lower portions of the flexure bond pads 520, 522, 524, 526, 528, 530, 532, and 534 are visible. After folding, the upper portions of the flexure bond pads 520, 522, 524, 526, 528, 530, 532, and 534 are not visible in FIG. 4B because such portions are disposed on the side of the flexure tail terminal region 500 that is facing away from the viewer. In certain embodiments, one or more of such upper portions may be covered by the insulative cover layer 516.

In the case of flexure bond pads 520, 522, 524, 526, 528, the lower portions depicted in FIG. 5B, that would be electrically connected to the FPC bond pads 380, are shown to be electrically continuous with corresponding upper portions on the side of the flexure tail terminal region 500 that is facing away from the viewer. In certain cases, this may be done to facilitate contact with probes for electrical test. In the case of flexure bond pads 530, 532, and 534, however, the lower portions depicted in FIG. 5B, that would be electrically connected to the FPC bond pads 380, are shown to be electrically discontinuous with corresponding upper portions on the side of the flexure tail terminal region 500 that is facing away from the viewer.

Figure 6A:
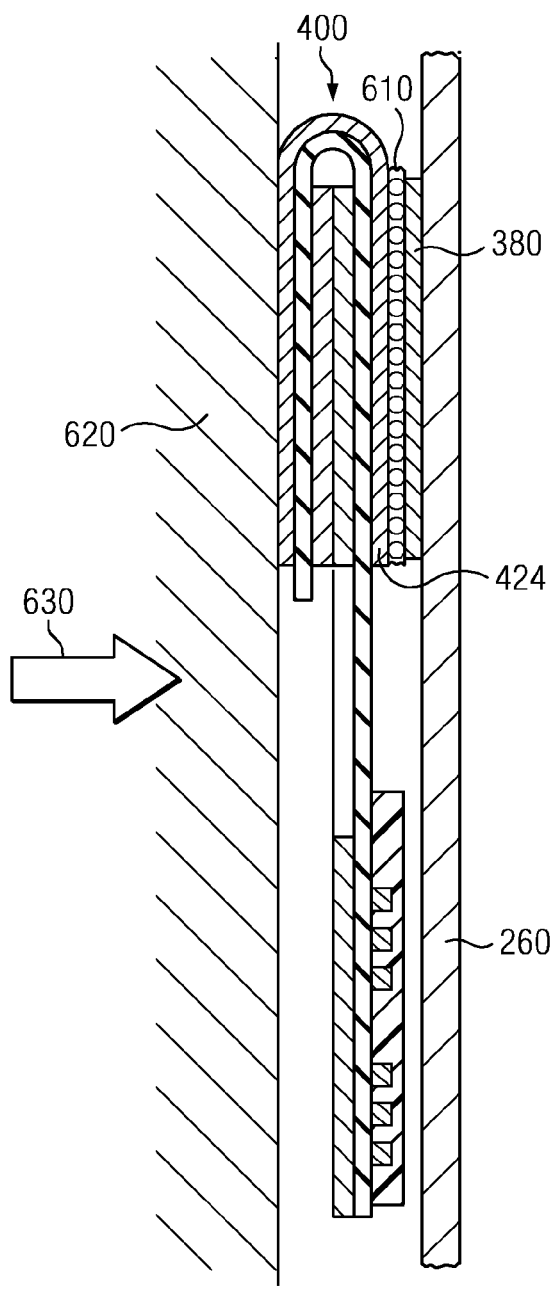
FIG. 6A depicts the bonding of a flexure bond pad to a corresponding flexible printed circuit bond pad by an anisotropic conductive film, according to an embodiment of the present invention.
Figure 6B:
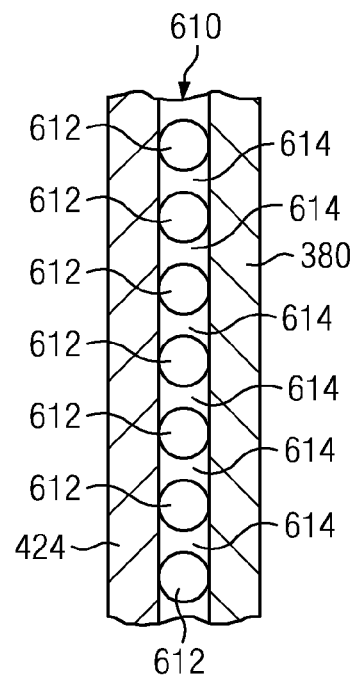
FIG. 6B is an expanded view of a portion of FIG. 6A.

In certain embodiments, each of the flexure bond pads (e.g. flexure bond pad 424 in the embodiment of FIGS. 4A-C) may be bonded to a corresponding one of the plurality of FPC bond pads 380 by an anisotropic conductive film (ACF). For example, FIGS. 6A-B depict the bonding of a flexure bond pad 424 to a corresponding FPC bond pad 380 by an ACF 610. A thermode tool 620 is brought into contact with the plurality of flexure bond pads after folding, with the thermode tool 620 pressing the plurality of flexure bond pads (e.g. including flexure bond pad 424) against the plurality of FPC bond pads (e.g. including the corresponding FPC bond pad 380) for a period. In this context, one of ordinary skill would understand that the phrase "after folding" does not necessarily mean immediately after folding; rather, there could be intermediate steps.

The ACF 610 may comprise an adhesive material 614 that includes a plurality of electrically conductive beads 612 of substantially similar diameter. In certain embodiments the ACF 610 may employ beads of non-spherical shape, such as cylindrical beads. In certain embodiments the adhesive material 614 may be deposited on to FPC bond pad 380 prior to aligning the flexure bond pad 424 thereto. Alternatively, the adhesive material 614 may be deposited on to a first side of the flexure bond pad 424 (facing the FPC bond pad 380), after folding and prior to bringing the thermode tool 620 into contact with an opposing second side of the flexure bond pad 424 (facing the thermode tool 620).

As shown in FIGS. 6A-B, the force 630 that presses (via the thermode tool 620) the flexure bond pad 424 against FPC bond pad 380 during the period of bonding, may arrange the plurality of electrically conductive beads 612 in a monolayer with each of the plurality of electrically conductive beads 612 in electrical contact with the flexure bond pad 424 and the corresponding FPC bond pad 380. The thermode tool 620 may also transfer heat through flexure bond pad 424 during the period of bonding, and raise the temperature of the adhesive material 614 during such period, for example to accelerate curing of the adhesive material 614.

In certain embodiments, the force 630 of the thermode tool 620 is sufficient to cause the electrically conductive beads 612 to be substantially elastically deformed in compression between the flexure bond pad 424 and the corresponding FPC bond pad 380 during the period of thermal curing of the adhesive material 614. After the thermode tool 620 is removed, the electrically conductive beads 612 cool (with the cured adhesive) from an elevated curing temperature. Such cooling causes the electrically conductive beads 612 to shrink relative to their expanded size during thermal curing of the adhesive material 614.

However, the force 630 is preferably chosen to be great enough that the post-curing shrinkage of the electrically conductive beads 612 cannot completely relieve the compressive deformation of the electrically conductive beads 612 that was experienced during curing. Hence, after curing of the adhesive material 614, and after removal of the thermode tool 620, the electrically conductive beads 612 may remain in compression (and somewhat compressively deformed) between the flexure bond pad 424 and the corresponding FPC bond pad 380.

Although residual compression of the electrically conductive beads 612 may correspond to some residual tension in the cured adhesive material 614, the such residual compression of the electrically conductive beads 612 may be desirable to enhance and ensure reliable electrical conductivity of the ACF 610. For example, in the case where the electrically conductive beads 612 are spherical, the residual compression may cause small flat spots where the electrically conductive beads 612 contact the flexure bond pad 424 and the corresponding FPC bond pad 380. Such flat spots can provide a finite contact areas rather than point contacts, which may desirably reduce the electrical resistance of the ACF 610.

To help facilitate higher volume manufacturing, the thermode tool 630 may include a flat surface that is substantially larger than any of the plurality of flexure bond pads, for example so that many bond pads may be subjected to the applied pressure and heat transfer simultaneously. The localized flexure tail thickness increases at the location of the bond pads, that result from folding the flexure tail 400 as shown and described previously with reference to FIG. 4C, may advantageously allow a large flat thermode tool (e.g. thermode tool 630) to provide pressure and heat only to the bond pad locations—without a need to first pattern or precisely align the thermode tool 630. This may advantageously simplify high volume manufacture. That is, in certain embodiments of the present invention, the local thickness variations of the flexure tail 400, that is caused by folding, may act as a self-aligning pattern to augment and assist the thermode tool to selectively apply pressure and heat more to desired bond pad locations of the flexure tail 400 than to undesired locations (e.g. locations away from the bond pads).

In the foregoing specification, the invention is described with reference to specific exemplary embodiments, but those skilled in the art will recognize that the invention is not limited to those. It is contemplated that various features and aspects of the invention may be used individually or jointly and possibly in a different environment or application. The specification and drawings are, accordingly, to be regarded as illustrative and exemplary rather than restrictive. For example, the word "preferably," and the phrase "preferably but not necessarily," are used synonymously herein to consistently include the meaning of "not necessarily" or optionally. "Comprising," "including," and "having," are intended to be open-ended terms.

What is claimed is:

1. A method to manufacture a head stack assembly for a disk drive, the method comprising:
   attaching a head gimbal assembly that includes a flexure tail having a plurality of flexure bond pads to an actuator that includes a flexible printed circuit (FPC) with a plurality of FPC bond pads;
   folding each of the plurality of flexure bond pads upon itself such that the flexure tail is substantially thicker at each of the folded flexure bond pads;
   aligning the plurality of flexure bond pads with the plurality of FPC bond pads;
   introducing an adhesive material that includes a plurality of electrically conductive beads of substantially similar size between each of the plurality of flexure bond pads and corresponding ones of the plurality of FPC bond pads; and
   bringing a thermode tool into contact with the plurality of flexure bond pads after folding, with the thermode tool pressing the plurality of flexure bond pads against the plurality of FPC bond pads for a period.

2. The method of claim 1 wherein the flexure tail comprises a structural layer, a dielectric layer, and a conductive layer, and wherein a thickness of the structural layer is less than 20 microns, a thickness of the dielectric layer is less than 15 microns, a thickness of the conductive layer is less than 15 microns, and a total folded thickness at each of the plurality of flexure bond pads is at least 60 microns.

3. The method of claim 1 wherein pressing the plurality of flexure bond pads against the plurality of FPC bond pads during the period arranges the plurality of electrically conductive beads in a monolayer with each of the plurality of electrically conductive beads in electrical contact with one of the plurality of flexure bond pads and the corresponding one of the plurality of FPC bond pads.

4. The method of claim 1 wherein the thermode tool includes a flat surface that is substantially larger than any of the plurality of flexure bond pads.

5. The method of claim 1 wherein the thermode tool transfers heat through the plurality of flexure bond pads during the period, and raises the temperature of the adhesive material during the period.

6. The method of claim 1 wherein folding precedes aligning the plurality of flexure bond pads.

7. The method of claim 1 wherein aligning the plurality of flexure bond pads precedes folding.

8. The method of claim 1 wherein introducing the adhesive material comprises depositing the adhesive material on to the plurality of FPC bond pads prior to aligning the plurality of flexure bond pads.

9. The method of claim 1 wherein introducing the adhesive material comprises depositing the adhesive material on to a first side of the plurality of flexure bond pads after folding and prior to bringing the thermode tool into contact with an opposing second side of the plurality of flexure bond pads.

10. The method of claim 1 wherein folding each of the plurality of flexure bond pads upon itself comprises simultaneously folding all of the plurality of flexure bond pads by folding a terminal region of the flexure tail upon itself.

* * * * *